United States Patent [19]

Tanaka et al.

[11] Patent Number: 5,506,429

[45] Date of Patent: Apr. 9, 1996

[54] CCD IMAGE SENSOR WITH STACKED CHARGE TRANSFER GATE STRUCTURE

[75] Inventors: Nagataka Tanaka, Yokohama; Nobuo Nakamura, Sagamihara; Yoshiyuki Matsunaga, Kamakura; Shinji Ohsawa, Tokyo; Michio Sasaki, Yokohama; Hirofumi Yamashita, Kawasaki, all of Japan; Ryohei Miyagawa, Pittsburgh, Pa.

[73] Assignee: Kabushiki Kaisha Toshiba, Kawasaki, Japan

[21] Appl. No.: 208,750

[22] Filed: Mar. 11, 1994

[30] Foreign Application Priority Data

Mar. 12, 1993 [JP] Japan ................................ 5-051795

[51] Int. Cl.⁶ .................... H01L 27/148; H01L 29/765
[52] U.S. Cl. ........................ 257/233; 257/250; 257/758
[58] Field of Search ............................. 257/231–233, 257/222, 223, 250, 758

[56] References Cited

U.S. PATENT DOCUMENTS

| | | | |
|---|---|---|---|
| 3,890,633 | 6/1975 | Kosonocky | 257/231 |
| 4,689,687 | 8/1987 | Koike et al. | 257/232 |
| 4,847,692 | 7/1989 | Tabei | 257/233 |
| 5,073,808 | 12/1991 | Kinoshita | 257/231 |
| 5,250,825 | 10/1993 | Negishi et al. | 257/250 |
| 5,256,890 | 10/1993 | Furukawa et al. | 257/233 |

OTHER PUBLICATIONS

Kazuya Yonemoto et al., ISSCC Digest of Technical Papers; (Feb. 1990), pp. 214–215.
Toshihida Nobusada et al., ISSCC Digest of Technical Papers; (Feb. 1989), pp. 88–89.
"Frame Interline Transfer CCD Sensor for HDTV Camera", T. Nobusada et al., 1989 IEEE International Solid-State Circuits Conference, pp. 88 & 89.
"A 2 Million Pixel FIT–CCD Image Sensor for HDTV Camera System", K. Yonemoto et al., 1990 IEEE International Solid-State Circuits Conference, pp. 214 & 215.

Primary Examiner—Gene M. Munson
Attorney, Agent, or Firm—Finnegan, Henderson, Farabow, Garrett & Dunner

[57] ABSTRACT

A CCD imager has an array of rows and columns of picture elements on a semiconductor substrate. A vertical charge transfer gate section extends in a first direction on the substrate to be associated with the columns. The transfer gate section includes CCD channels in the substrate, and insulated transfer gate electrodes overlying these CCD channels. A plurality of buffer electrodes are formed at a first level over the substrate surface to overlie the transfer gate electrodes. A plurality of shunt wires are formed at a second level over the substrate surface to overlie the buffer electrodes. The charge transfer gate electrodes and the buffer electrodes are connected with each other by first contact holes. The buffer electrodes and the shunt wires are coupled together by second contact holes. The second contact holes are distributed so that the repeat period thereof as defined at least in a second direction transverse to the first direction on the substrate is equal to or less than two picture elements, whereby their spatial frequency at least in the second direction is half the sampling frequency of photoconversion in the CCD imager, or more.

6 Claims, 9 Drawing Sheets

CCD IMAGE SENSOR WITH STACKED CHARGE TRANSFER GATE STRUCTURE

BACKGROUND OF THE INVENTION

1. Field of the Invention

The present invention relates in general to solid-state image sensing devices, and in more particular to solid-state imagers for use in television cameras of higher resolution. More specifically, the invention relates to charge coupled device (CCD) image sensors preferably employed in highly advanced television image pickup systems, including a simultaneous all-pixel read system (called the "progressive scanning" system), an enhanced vertical definition system known as "EVS," or the like.

2. Description of the Related Art

With the increasing needs for high performance of television broadcasting systems, development of a highly advanced solid state image sensing device with an extra high resolution and high reliability has been demanded strongly. Even the presently available charge-coupled device (CCD) image sensors have accomplished several hundreds of thousands of picture elements (pixels), which are increased in number enough to meet the requirements in the existing television broadcasting systems, such as NTSC, PAL, or the like. However, by taking account of the possible application to a new high-definition television broadcasting system known as "HDTV" in the near future, CCD imager sensors will soon be demanded to further increase in the pixel density, thus providing an extremely greater number of pixels that ranges from one million and three hundreds of thousands to two millions.

A problem raised when the CCD image sensors are forced to attain such greater number of pixels is an increase in the frequency of drive pulse signals thereof. As the drive frequency increases, the risk of delaying the drive pulses and/or "rounding" the drive pulse waveform may increase due to the presence of the resistance and the parasitic capacitance of the transfer electrodes of the CCD image sensors. This may affect seriously the image pickup performance of such CCD imagers.

One advance made in the prior art to overcome such problem is the multilayered charge transfer electrode structure, wherein a low-resistance metal wiring layer is stacked on each of the transfer electrodes (typically, the vertical charge transfer electrodes), causing the resistance thereof to reduce as a whole to thereby suppress or prevent the occurrence of pulse delay and the rounding of pulse waveform. Such extra low-resistance wiring layer is well-known as the "backplate wire" or "shunt electrode" among experts in the art of CCD devices. The shunt electrode is electrically connected to a corresponding one of the charge transfer electrodes by means of a plurality of contact holes.

A CCD imager having the stacked transfer-gate/shunt electrode structure is disclosed, for example, in "Frame Interline Transfer CCD Sensor for HDTV Camera," by T. Nobusada et al., 1989 IEEE International Solid-State Circuits Conference (ISSCC), 1989 at p. 89 (FIG. 1). With the "Poly-Si/Al double-layer" transfer gate structure disclosed therein, a plurality of parallel insulated aluminum wires extend on vertical charge transfer gates above a CCD substrate. Contact holes are arranged at the preselected positions between the aluminum wires and the vertical charge transfer gates to provide electrical interconnection therebetween. As is apparent from viewing FIG. 1 of the IEEE paper, the contact holes are specifically distributed so that these contacts are positioned in a diagonally extending direction to the elongate direction of the parallel aluminum wires (shunt electrodes).

Unfortunately, the advantages provided by the CCD imager do not come without accompanying penalties. Since the contact holes for the aluminum wires are formed directly on the underlying vertical transfer gate layers, the charge transfer channel regions formed in the surface of the substrate may vary in potential at specific portions beneath the contacts of the transfer gate layers. Such undesirable potential variation in the charge transfer channel regions leads to the occurrence of a partial potential shift therein, as has been known as the "potential pocket" among those skilled in the CCD device art. The occurrence of potential pocket is a bar to the achievement of smooth flow (or vertical transfer) of charge packets indicative of a sensed image in the charge transfer channels. The charge transfer rate is thus reduced causing the CCD imager to decrease in the image pickup performance.

Another CCD imager with the stacked transfer-gate/shunt electrode structure is disclosed, for example, in "A 2 Million Pixel FIT-CCD Image Sensor for HDTV Camera System," by K.Yonemoto et al., 1990 IEEE ISSCC, 1990 at p. 215 (FIG. 2). With the FIT-CCD imager, a vertical charge transfer electrode made from polycrystalline silicon (poly-Si) is provided with a stacked shunt-layer structure consisting of a poly-Si layer and an aluminum wiring layer stacked on each other. The poly-Si layer extends above the vertical charge transfer electrode, whereas the aluminum wire runs above the poly-Si layer to provide a triple-layered charge transfer gate electrode structure. The intermediate poly-Si layer between the underlying transfer electrode and the overlying aluminum layer is called the "buffer electrode" in some cases. Another saying of this is that the buffer electrode is additionally inserted between the transfer electrode and the shunt electrode. The presence of such intermediate buffer electrode can successfully suppress the occurrence of a potential pocket in the transfer channels in the substrate.

With the multiple-layered lamination structure for the charge transfer gate electrode, the electrical coupling between the transfer electrode and the poly-Si buffer electrode is achieved by a plurality of first contact holes formed therebetween. The electrical interconnection between the buffer electrode and the aluminum shunt electrode is attained by the use of a plurality of second contact holes arranged between them. The first and second contact holes are specifically distributed on the parallel transfer gate electrodes so that the first and second contact holes do not occupy the same planar positions.

More specifically, the distribution pattern of the second contact holes (or, "buffer-to-shunt" contacts) is defined with four pixels as a unit in the horizontal direction on the substrate surface of the CCD imager. The repeat period is thus four pixels. This means that, looking at a matrix of rows and columns of pixels as a whole, the distribution or positioning pattern of the first and second contacts around the photoelectrically converted charge storage sections of such pixels does not remain uniform. For example, around the charge storage section of a certain pixel, two "first" contact holes and one "second" contact hole are located; on the other hand, only one second contact hole is merely formed around the charge storage section of another pixel. As a result of the use of such layout pattern of first and second contact holes, four different kinds of patterns are present due to the fact that the repeat period is four pixels. The coexistence of such different kinds of first/second contact-hole patterns inevitably causes the incident-light entrance characteristic to be unable to remain uniform; this results in that the sensitivity locally varies among an increased number of pixels on the substrate.

A more significant problem faced with the prior-art CCD imager is the fact that the coexistence of four kinds of contact patterns, which is resulted from the arrangement that the repeat period of the second contact holes ("buffer-to-shunt" contacts) in the horizontal direction X is defined with four pixels being as a unit, may accelerate noises to occur so that the resultant signal-to-noise ratio decreases, for the reasons as follows. As the repeat period of buffer-to-shunt contacts is four pixels, the spatial frequency fc of the contact pattern in this case is a quarter of the CCD sampling frequency fs. On the other hand, as is well known, the upper limit of the frequency band of an image signal is slightly lower than the half of the sampling frequency fs. Naturally, the spatial frequency fc of the contact pattern falls within the image-signal frequency band. This may cause noises to take place in the image signal.

SUMMARY OF THE INVENTION

It is therefore an object of the present invention to provide a new and improved solid-state image sensing device.

It is another object of the invention to provide a new and improved solid-state charge-coupled device imager with an increased pixel density and enhanced performance and reliability.

It is further object of the invention to provide a new and improved solid-state charge-coupled device imager of extra high integration density for use in a high definition television system, which imager can attain an enhanced pickup image quality at higher signal-to-noise ratio and higher reliability.

In accordance with the above objects, the present invention is drawn to a specific solid-state image sensing device, which includes a substrate, and an array of rows and columns of picture elements on the substrate. A charge transfer section extends in a first direction and is associated with the picture elements. The charge transfer section includes charge transfer channel regions in the substrate, and charge transfer electrodes insulatively overlying the channel regions. A plurality of first conductive strips are formed at a first level above the substrate to insulatively overlie the charge transfer electrodes. A plurality of second conductive strips are formed at a second level above the substrate to insulatively overlie the first strips. A plurality of first contact holes are arranged for electrically interconnecting the charge transfer electrodes and the first strips with each other. A plurality of second contact holes are provided for electrically interconnecting the first strips and the second strips. The second contact holes are specifically positioned to provide a distributed pattern having a repeat period that is two picture elements or less at least in a second direction transverse to the first direction on the substrate, whereby a spatial frequency of the second contact holes at least in the second direction is half or more a sampling frequency of photoconversion of the device.

The foregoing and other objects, features, and advantages of the invention will become apparent from the following more particular description of preferred embodiments of the invention, as illustrated in the accompanying drawings.

DETAILED DESCRIPTION OF PREFERRED EMBODIMENTS

Figure 1:
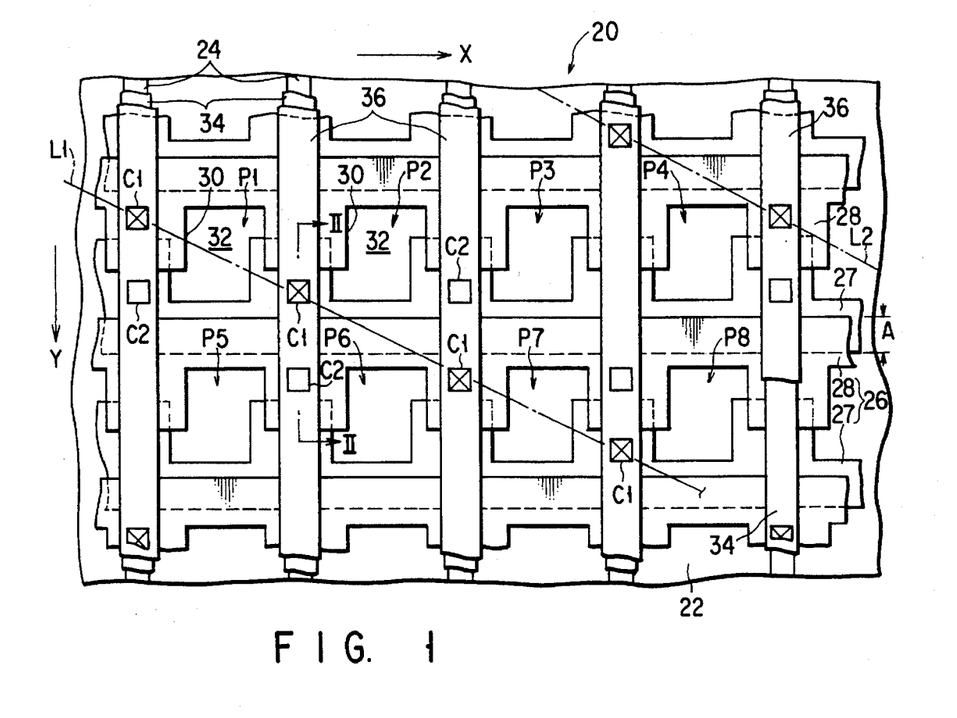
FIG. 1 is a diagram showing a plan view of the main part of A CCD imager in accordance with one preferred embodiment of the invention.

Referring now to FIG. 1, a charge-coupled device (CCD) image sensing device in accordance with one preferred embodiment of the invention is generally designated by the numeral 20. Note that the planar diagram of FIG. 1 omits the depiction of dielectric layers between several stacked layers for purposes of illustration only, thereby to reveal the configuration of some overlapped layers on or above the substrate surface.

The CCD imager 20 includes a semiconductive substrate 22, such as silicon. Substrate 22 is doped to be, for example, of p type conductivity. A plurality of parallel semiconductive layers 24 of n type conductivity are formed as CCD channel layers, which extend in a first direction on the surface of substrate 22, that is, the vertical direction Y of FIG. 1. While these CCD channels 24 are not visible in the plan view of FIG. 1, one of them can be seen in the cross-section of FIG. 2.

Figure 2:
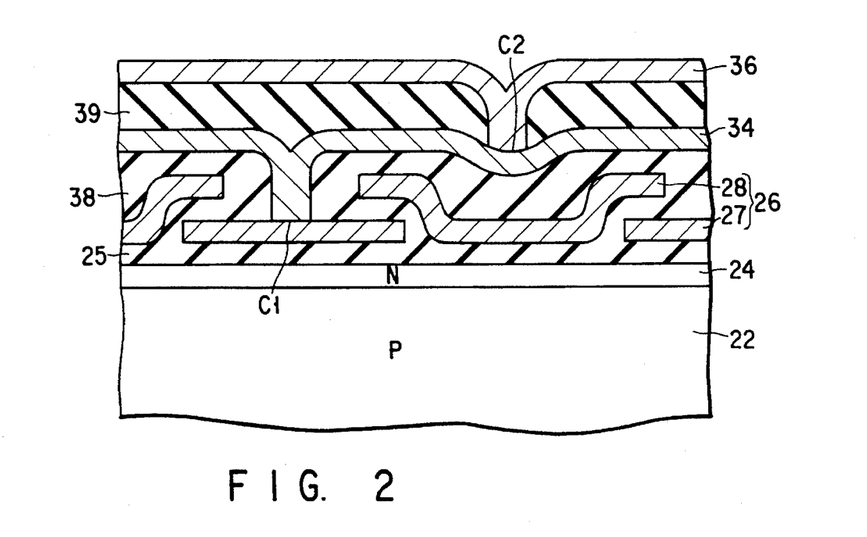
FIG. 2 is a diagram showing a partial cross-sectional structure of the embodiment of FIG. 1 along a line II—II.

As shown in FIG. 2, the CCD channels 24 are insulatively covered by charge transfer electrode sections 26. Each charge transfer electrode section 26 consists of first and second alternate electrode segments 27, 28 being partially overlapped each other with a dielectric layer 25 being sandwiched between CCD channels 24 and electrode segments 27, 28. Electrode section 26 will be referred to as the "vertical charge transfer gate electrodes" in the rest of the description. CCD channels 24 and vertical charge transfer gates 26 may constitute vertical CCD charge-transfer shift registers of the CCD imager 20.

The planar structure of the first and second segments 27, 28 constituting the vertical charge transfer gate electrodes 26 is illustrated in FIG. 1. These segments 27, 28 may be a plurality of pairs of approximately "comb"-shaped layers made from polycrystalline silicon. Each of these layers 27, 28 has a "spine" portion extending in a second direction (the horizontal direction X) transverse to the first direction (the vertical direction Y) over the surface of substrate 22, and a plurality of "finger" or "tooth" portions that extend in the first direction from the spine portion and correspond in number to the parallel CCD channels 24. Each pair of polycrystalline silicon layers 27, 28 overlap each other at their tooth portions as shown in FIG. 1, thereby to define an array of square openings 30 therebetween on the substrate surface. Openings 30 correspond to incident-light entrance windows of photoelectrically converted charge storage sections 32 of a matrix of rows and columns of picture elements (pixels) P. Charge storage sections 32 will be called the "signal charge storage sections" hereinafter in the description. Each of these signal carrier storage sections 32 may be a known photodiode.

The vertical transfer CCD shift registers 24 are connected to a known horizontal charge-transfer CCD shift register section (not shown) extending in the second direction X on the substrate 22. The horizontal CCD shift register has an output connected to a known signal amplifier circuitry (not shown).

As shown in FIG. 1, a plurality of first parallel conductive strips 34 and a plurality of second parallel conductive strips 36 are insulatively stacked sequentially on the vertical transfer gates 26. First strips 34 are made from polycrystalline silicon, which may correspond to the prior art "buffer electrode" as described previously in the introductory part of the description. Second strips 36 is made from low-resistance metallic material, which may correspond to the "shunt electrode" in the prior art. A dielectric layer 38 is sandwiched between the first and second vertical transfer electrodes 27, 28 and the buffer electrodes 34. A dielectric layer 39 is sandwiched between buffer electrodes 34 and the overlying shunt electrodes 36. Electrodes 34, 36 provide a "double-layered transfer gate" structure.

The electrical coupling between the buffer electrodes 34 and the shunt electrodes 36 is achieved by the use of a plurality of contact holes C. These contact holes include first contact holes C1 and second contact holes C2. First contact holes C1 are formed between the vertical transfer gates 26 and the buffer electrodes 34 to electrically connect them together. Second contact holes C2 are formed between buffer electrodes 34 and the shunt electrodes 36 to connect them with each other. Note that, in the plan view of FIG. 1, first contact holes C1 are indicated by fine solid-line rectangular boxes filled with the letter "X" therein, whereas second contact holes C2 are indicated by empty fine solid-line rectangular boxes for purposes of illustration only.

The distribution positions of the first and second contact holes C1, C2 on the substrate surface is specifically determined as will be described below. First contact holes C1 are formed so as to sequentially shift in position by a predetermined distance along the first direction (vertical direction Y) with four adjacent ones of the buffer electrode strips 34 being as a unit. As a result, looking at eight pixels P1, P2, ..., P8 of "4×2" partial matrix associated with four vertical CCD shift registers beneath the four buffer electrodes 34, four first contact holes C1 are aligned substantially in a reference line L1 represented as a dash-and-dot line in FIG. 1 for simplicity, which line L1 extends diagonally with respect to the four elongate buffer electrodes 34 at a certain angle. Looking at each buffer electrode 34 more precisely, the distance between adjacent ones of the first contact holes C1 in the vertical direction Y is constant. This distance may be equivalent to the length of two neighboring pixels in vertical direction Y. Accordingly, in the partial plan view of FIG. 1, other first contact holes C1 are also visible which are aligned in another parallel reference line L2 that is paced apart from the diagonally extending reference line L1.

The positioning rule for the second contact holes C2 (or the "shunt-to-buffer connecting" contacts) is different from that for the first contact holes C1. As illustrated in FIG. 1, second contact holes C2 are formed in a zig-zag fashion so that these contacts are alternately positioned at the opposite sides of a linear area E whereat the spine portions of first and second neighboring vertical transfer gate segments 27, 28 overlap each other in part. Another saying of this is that, looking at the aforesaid eight pixels P1–P8, four second contact holes C2 being arranged on four shunt electrode strips 36 associated with pixels P1–P8 are specifically studded or scattered to define the letter "W" with the spine overlap region E being as a center line, together with another second contact holes C2 formed at a shunt electrode strip 36 that neighbors on pixels P4, P8. As a result of this, the repeat period of the distribution pattern of second contact holes C2 is as small as two pixels in both the horizontal direction X and the vertical direction Y.

With the use of such specific positioning patterns for the contact holes C1, C2 in the CCD imager 20 of FIG. 1, while the first contact holes C1 (or "transfer-gate to buffer connecting" contacts) have a horizontal repeat period of four pixels, the second contact holes C2 (or the "shunt-to-buffer" contacts) have a reduced repeat period that is only two pixels horizontally and vertically on the substrate 22. Therefore, with respect to both the horizontal and vertical directions X, Y, the spatial frequency fc of shunt-to-buffer contacts C2 can be substantially half the sampling frequency fs of photoconversion of the CCD imager 20. This ensures that the incident-light entrance characteristic can remain uniform among pixels P1–P8 successfully. It is thus possible to suppress or almost eliminate the occurrence of variations in the sensitivity among an increased number of pixels.

Figure 3:
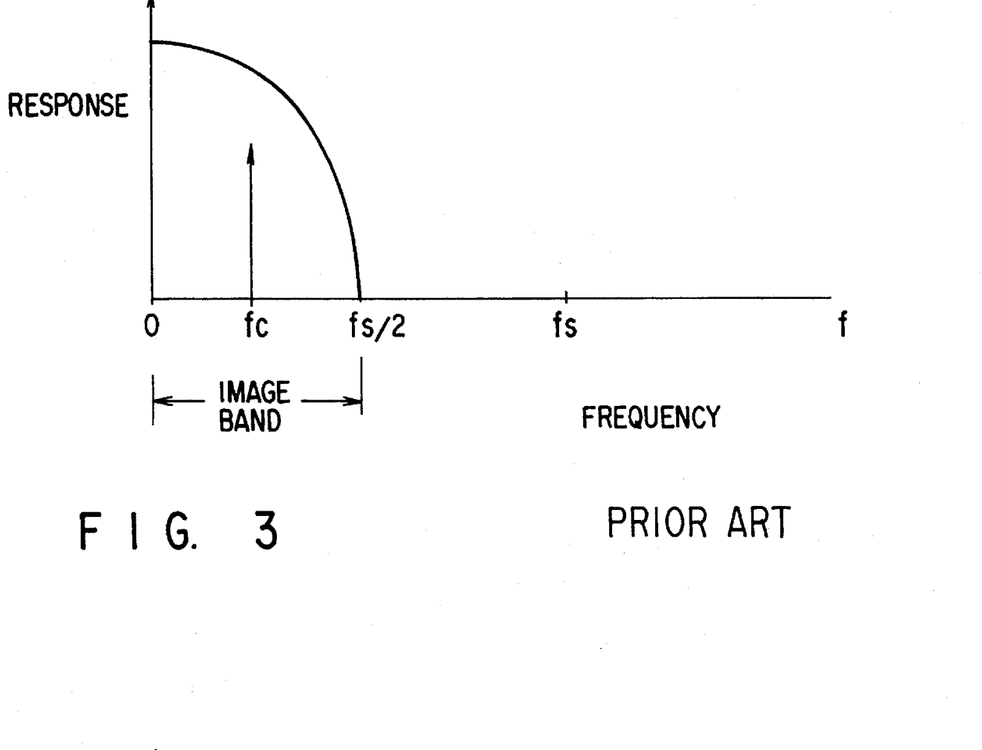
FIG. 3 is a graph indicating the frequency versus response characteristic in the prior art CCD imager and FIG. 4 is graph showing the frequency versus response characteristic of the embodiment of FIGS. 1–2.
Figure 4:
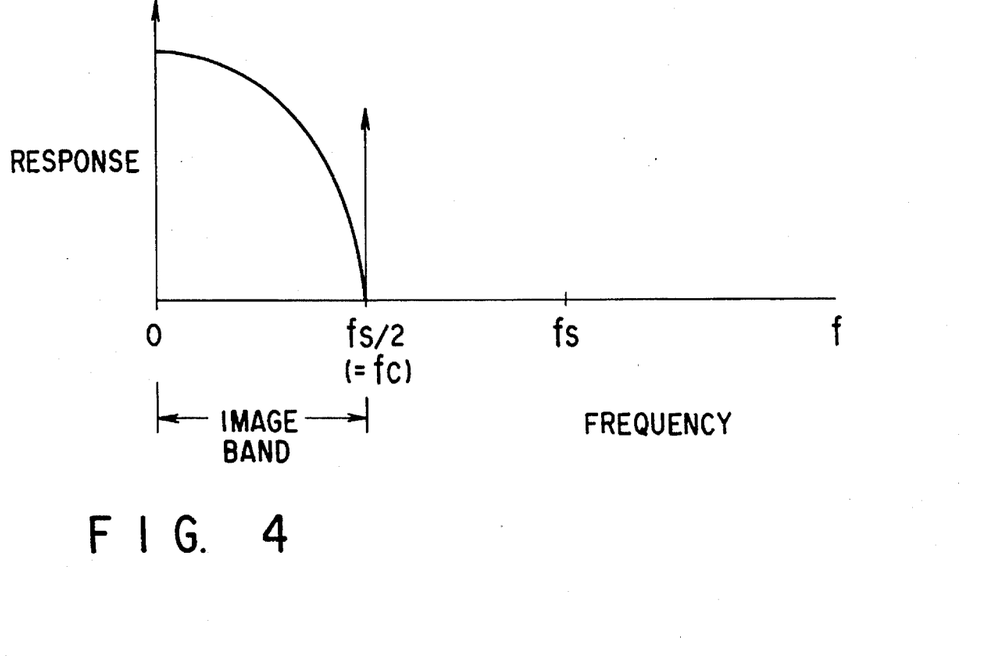

Furthermore, it is possible to improve dramatically the signal-to-noise ratio of an image signal of the CCD imager 20. The advantage will be described in detail with reference to the characteristic diagrams shown in FIGS. 3 and 4. FIG. 3 is a graph showing the frequency versus response characteristic of the prior art CCD imager as has been described in the introductory part of the description. FIG. 4 shows the frequency versus response characteristic of the CCD imager 20 of FIGS. 1 and 2. In each of the graphs, the axis of abscissa indicates the frequency, wherein "fc" is the spatial frequency of shunt-to-buffer contacts C2, and "fs" is the sampling frequency. For evenhanded comparison, assume that the prior-art CCD imager and the embodiment CCD imager 20 are operated under the same charge read scheme, that is, what is called the "progressive scanning" system wherein no additions are made while charge packets are read out.

In the prior art imager, as shown in FIG. 3, the spatial frequency fc of the distribution pattern of contact holes is a quarter of the sampling frequency fs in principle. Generally, the frequency band of an image signal is fs/2. As a result, the spatial frequency fc of contact pattern is included in the image band. This causes noises raised by the contact pattern to be mixed into an image pickup signal. The resultant image signal decreases in quality, and the signal-to-noise ratio decreases.

In contrast, with the embodiment CCD imager 20, the spatial frequency fc of the shunt-to-buffer contacts C2 is equivalent to half the sampling frequency fs in both of the horizontal and vertical directions X, Y. Therefore, as shown in FIG. 4, the spatial frequency fc of contacthole pattern is twice that in the case of FIG. 3. This results in that the spatial frequency fc of contact-hole pattern is substantially same as fs/2. Since fs/2 may correspond to the upper limit of an image signal band as described previously, the spatial frequency fc of contact-hole pattern lies outside the image signal band. This ensures that, even if noises take place due to the contact hole pattern, the mixture of such noises into an image signal can be eliminated. The image signal can thus be improved in quality. In other words, the signal-to-noise ratio can be increased. Note here that, in the CCD imager 20 of FIG. 1, while the spatial frequency fc of the transfer-gate/ buffer contacts C1 remains at substantially the same level as the prior art, such arrangement will not affect the signal-to-noise ratio since contact holes C1 are specifically formed on the vertical transfer gates 26 that are formed at the lowermost level above the substrate 22 and nearest to the top surface of substrate 22.

Figure 5:
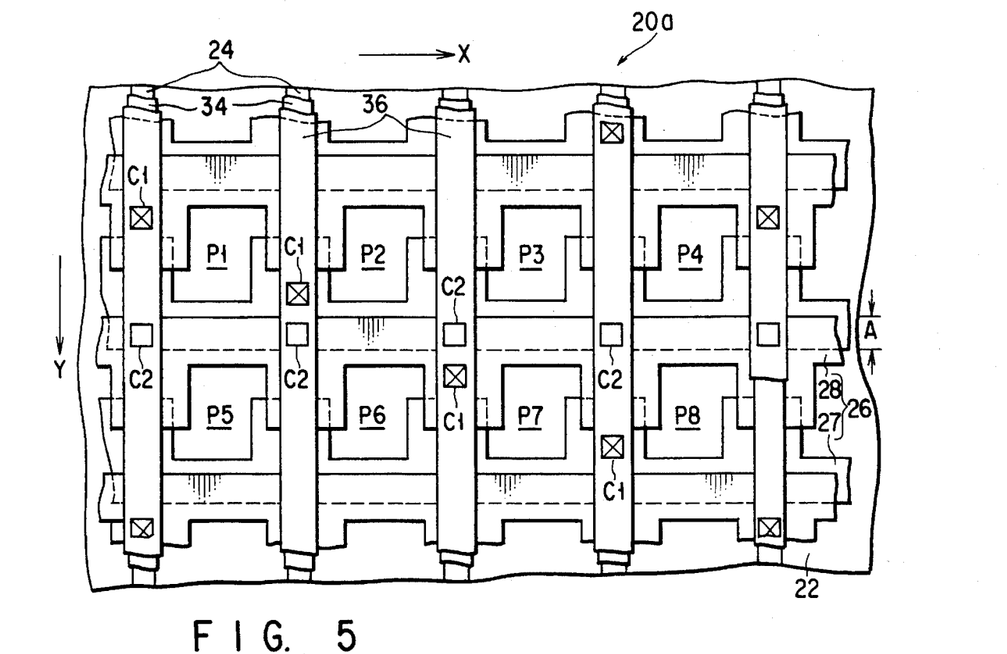
FIG. 5–10 and 12–13 show the plan views of several modifications of the CCD imager of FIG. 1.

A CCD imager 20a shown in FIG. 5 is similar to the CCD imager 20 of FIG. 1 with the second contact holes C2 being modified in planar distribution, as will be explained below. The distribution of second contact holes C2 (that is, shunt-to-buffer contacts for connecting together the upper shunt electrodes 36 and the intermediate buffer electrodes 34) is determined such that, looking at the eight pixels P1–P8, contact holes C2 are aligned along the spine overlap region A of a pair of first and second vertical transfer electrode segments 27, 28. In other words, shunt-to-buffer contacts C2 are arranged in the horizontal direction X on alternate ones of a plurality of spine overlap regions A. In this case, the repeat period of shunt-to-buffer contacts C2 is one pixel in the horizontal direction X, and is two pixels in the vertical direction Y. This means that the spatial frequency fc of contact holes C2 is equivalent horizontally to the sampling frequency fs of the CCD imager 20a; vertically, the spatial frequency fc of contacts C2 is almost half the sampling frequency fs of CCD imager 20a. With such an arrangement, the similar advantages to those of the embodiment 20 can be attained.

Figure 6:
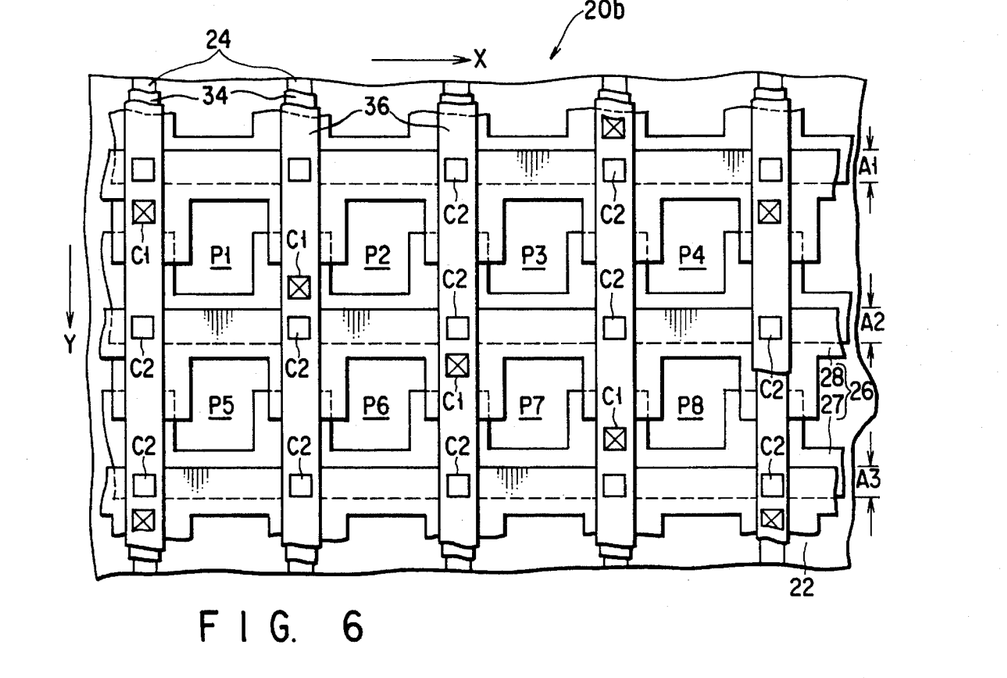

A CCD imager 20b shown in FIG. 6 is similar to that of FIG. 5 with the shunt/buffer contacts C2 being increased in number so that these contacts C2 are formed and arrayed on each of the spine overlap regions A1, A2, A3 of a plurality of pair of first and second vertical transfer electrode segments 27, 28 associated with the eight pixels P1–P8. As a result, the number of contact holes C2 is triple the number of the same in FIG. 5. With the embodiment, the repeat period of shunt/buffer contacts C2 is one pixel in both the horizontal direction X and the vertical direction Y. This means that the spatial frequency fc of the distribution pattern of contacts C2 is equivalent to the sampling frequency fs in both directions X, Y. With such an arrangement, the same or better image quality enhancement can be accomplished in comparison with the embodiment 20a.

Figure 7:
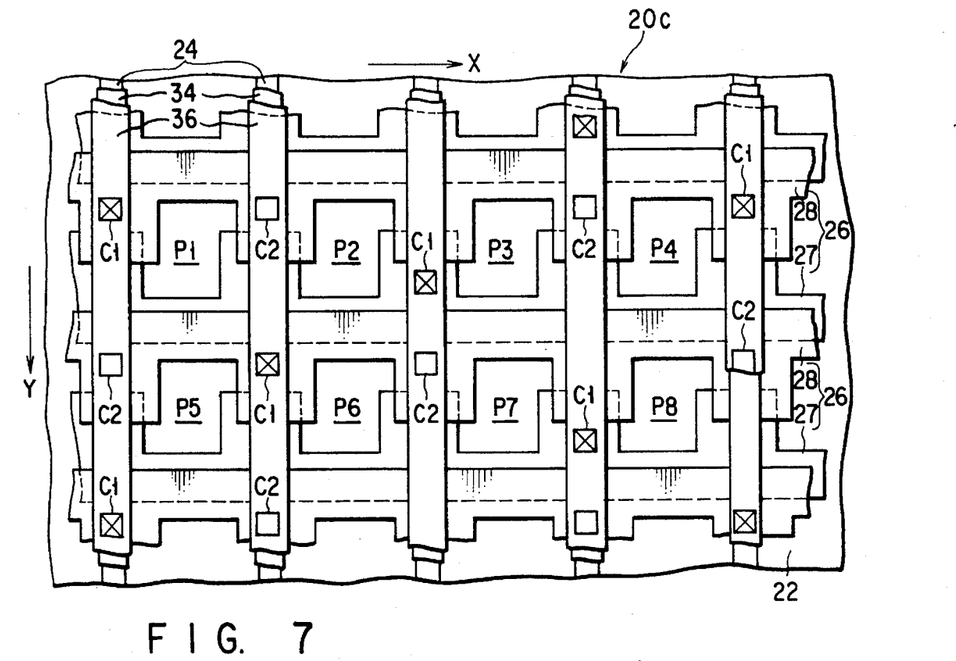

A CCD imager 20c shown in FIG. 7 is similar to the imager 20 of FIG. 1 with the shunt/buffer contacts C2 being modified in arrangement as follows. All the contact holes C2 are alternately arranged on the "teeth" of the second electrode segments 28 of the vertical transfer gates 26 with respect to the horizontal and vertical directions X, Y, thereby to provide a "zig-zag stud" pattern. With the use of such zig-zag pattern of contact holes C2, the distribution of the first contact holes C1 (that is, the "transfer-gate to buffer" contacts for connecting together the transfer gates 26 and the intermediate buffer electrodes 34) is modified in such a manner that two midway ones of the four contact holes C1 aligned along the diagonally extending reference line L1 of FIG. 1 are exchanged in position with each other, thereby to provide a "triangular waveform" like distribution pattern. With such an arrangement, the repeat period of contact holes C2 is two pixels in the both directions X, Y. The spatial frequency fc of such contact-hole distribution pattern is thus half the sampling frequency fs of CCD imager 20c in the both directions X, Y.

Figure 8:
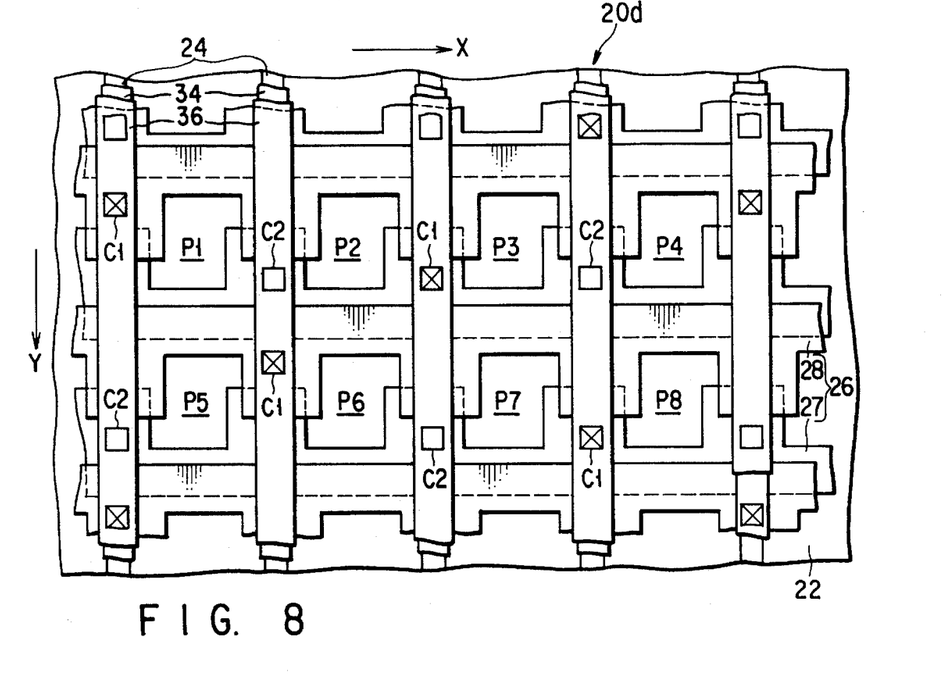

A CCD imager 20d shown in FIG. 8 is similar to the imager 20c of FIG. 7 with the shunt/buffer contacts C2 being modified as follows: All of them are alternately positioned on the teeth portions of the first electrode segments 27 of the vertical transfer gates 26 with respect to the both horizontal and vertical directions X, Y, thereby to provide a zig-zag pattern that is positionally shifted in the vertical direction Y from the zig-zag stud pattern of FIG. 7. With the embodiment also, the repeat period of contact holes C2 is two pixels in the both directions X, Y; therefore, the spatial frequency fc of the contact-hole distribution pattern is half the sampling frequency fs in the both directions X, Y.

Figure 9:
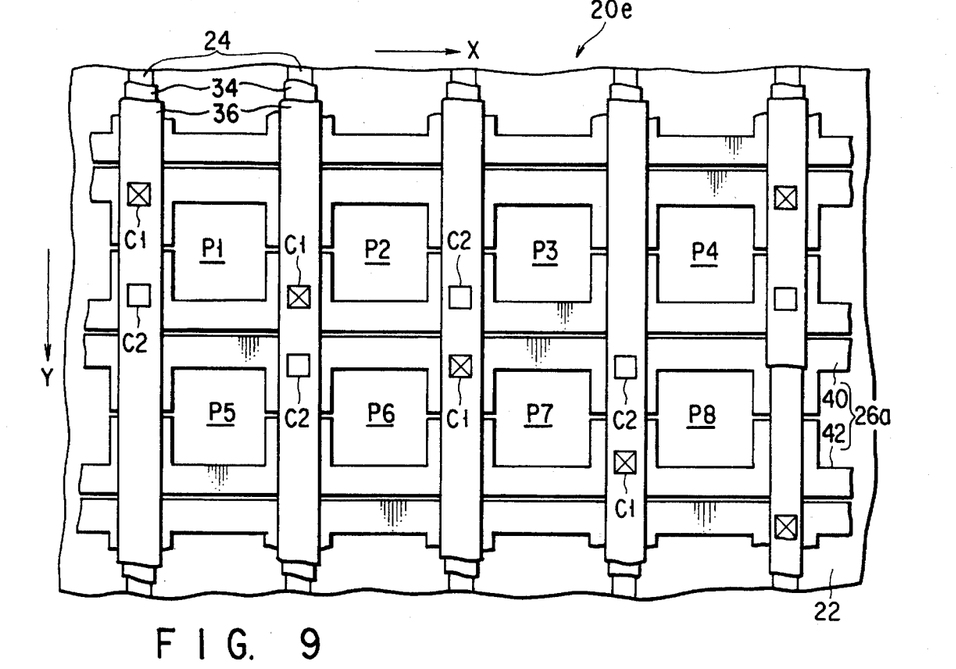

A CCD imager 20e shown in FIG. 9 is similar to the CCD imager 20 of FIG. 1 with each pair of the partly overlapping first and second transfer electrode segments 27, 28 being replaced with first and second planar transfer electrode segments 40, 42 that are formed at the same level over the substrate 22. With the CCD imager 20e having such single-layered vertical transfer electrode structure, also, the advantages of the invention can be accomplished successfully.

Figure 10:
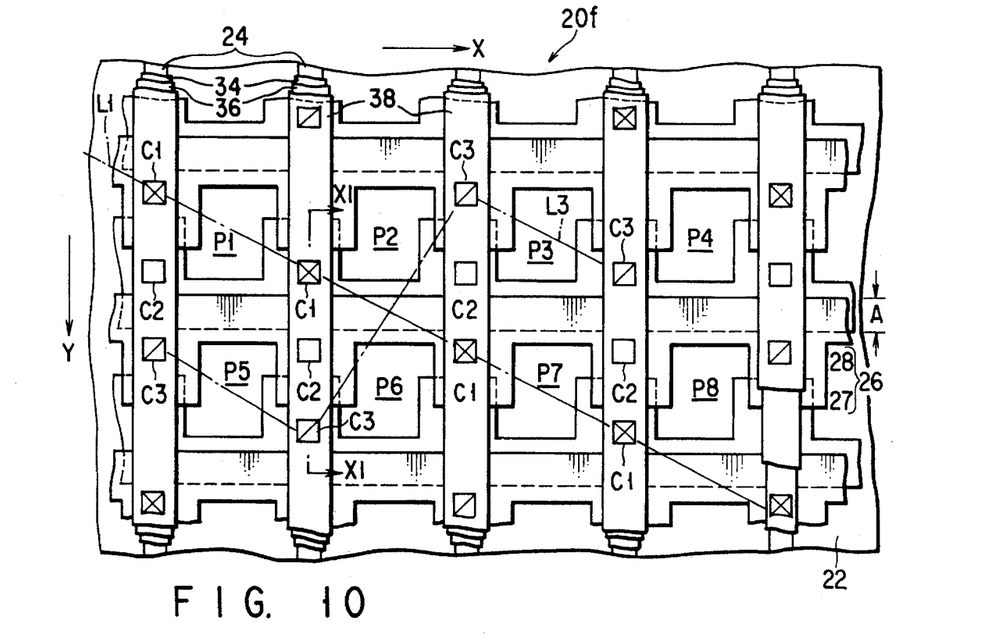
Figure 11:
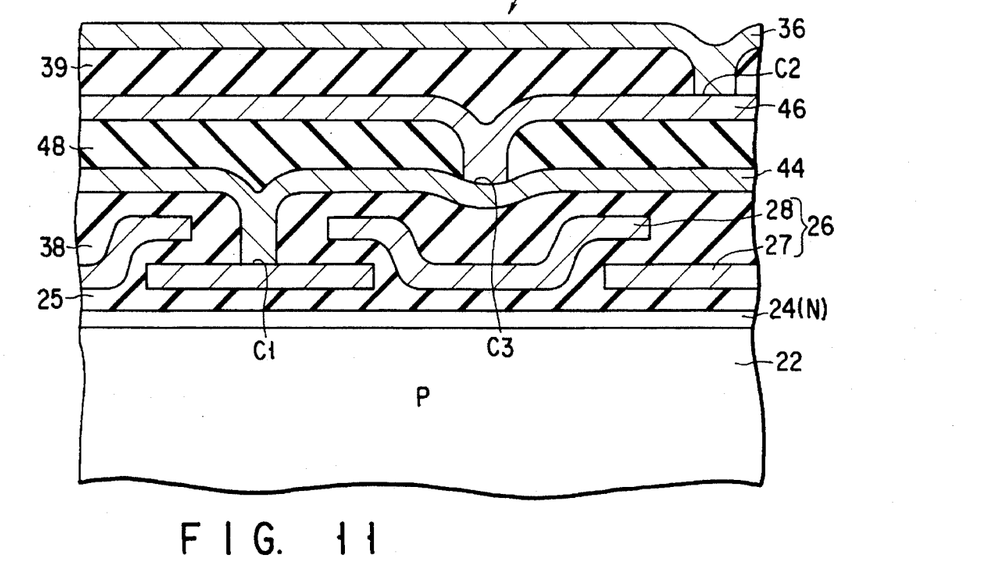
FIG. 11 is a diagram showing a partial cross-sectional view of the embodiment of FIG. 10 along a line XI—XI.

A CCD imager 20f shown in FIGS. 10 and 11 is similar to the imager 20 of FIGS. 1 and 2 with the intermediate buffer electrode 34 of FIG. 2 being replaced with first and second buffer electrodes 44, 46 that are stacked on each other, to thereby provide a "three-layered backplate" structure as a whole.

More specifically, as shown in FIG. 11, the first intermediate buffer electrode 44 insulatively overlies the transfer gate segments 27, 28 that constitute the vertical transfer gate 26. The dielectric layer 38 lies between the first buffer electrode 44 and the transfer gate segments 27, 28. Buffer electrode 44 is electrically contacted with transfer gate 26 by a plurality of contact holes C1 (see FIG. 10 as only one of them is visible in FIG. 11). First buffer electrode 44 may correspond to the layer 34 of FIG. 2. First buffer electrode 44 may be made from polycrystalline silicon.

As illustrated in FIG. 11, the second intermediate buffer electrode 46 is formed at an intermediate level between the first buffer electrode 44 and the shunt electrode 36 over the substrate surface. Second buffer electrode 46 is electrically insulated by dielectric layer 48 from the underlying buffer electrode 44. Second buffer electrode 46 is electrically connected by a plurality of third contact holes C3 (see FIG. 10 as only one of them is visible in FIG. 11) to the underlying buffer electrode 44. The upper shunt electrode 36 of FIG. 2 extends above second buffer electrode 46 and is connected by second contact holes C2 to second buffer electrode 46. Second buffer electrode 46 may be made from molybdenum-silicon.

The planar distribution pattern of the first, second and third contact holes C1, C2, C3 is apparent from viewing the illustration of FIG. 10. In FIG. 10, thin solid-line rectangles filled with virgules are used to indicate the third contact holes C3 for purposes of illustration only. Looking at the aforementioned partial "4×2" matrix of eight pixels P1–P8, the first contact holes C1 are arranged along the diagonally extending reference line L1 in the same manner as in the case of FIG. 1. The second contact holes C2 are alternately arranged on the opposite sides of the spine overlap region A of the pair of first and second vertical transfer electrode segments 27, 28 in the same manner as in FIG. 1, thereby to define a "zig-zag stud" patter.

As is apparent from viewing the planar structure of the CCD imager 20f as a whole, the third contact holes C3 are arranged in parallel with the diagonal reference line L1 as shown in FIG. 10. As far as the eight pixels P1–P8 concerned, four contact holes are provided as the third contact holes C3 in such a manner that two of them are located near the lower left-hand pixels P5, P6 whereas the remaining two of them are near the upper right-hand pixels P3, P4. A "constellation" defined by connecting these four contact holes C3 (as indicated by a dash-and-two-dot line L3 in FIG. 10) resembles one of the two bent-line portions of the symbol "gammadion."

With such an arrangement, the repeat period of the planar distribution pattern of the second contact holes C2 (that is, the shunt/buffer contacts for connecting the upper shunt electrodes 36 and the second intermediate buffer electrodes 46 together) is two pixels in the horizontal and vertical directions X, Y, while such the uppermost contact pattern may affect most significantly the sensitivity characteristic of incident light of the CCD imager 20f. The spatial frequency fc of such contacts C2 is substantially half the sampling frequency fs. The repeat period of the first and third contact holes C1, C3 is not two pixels; such fact will not so important as the influence thereof may remain negligible in principle.

Figure 12:
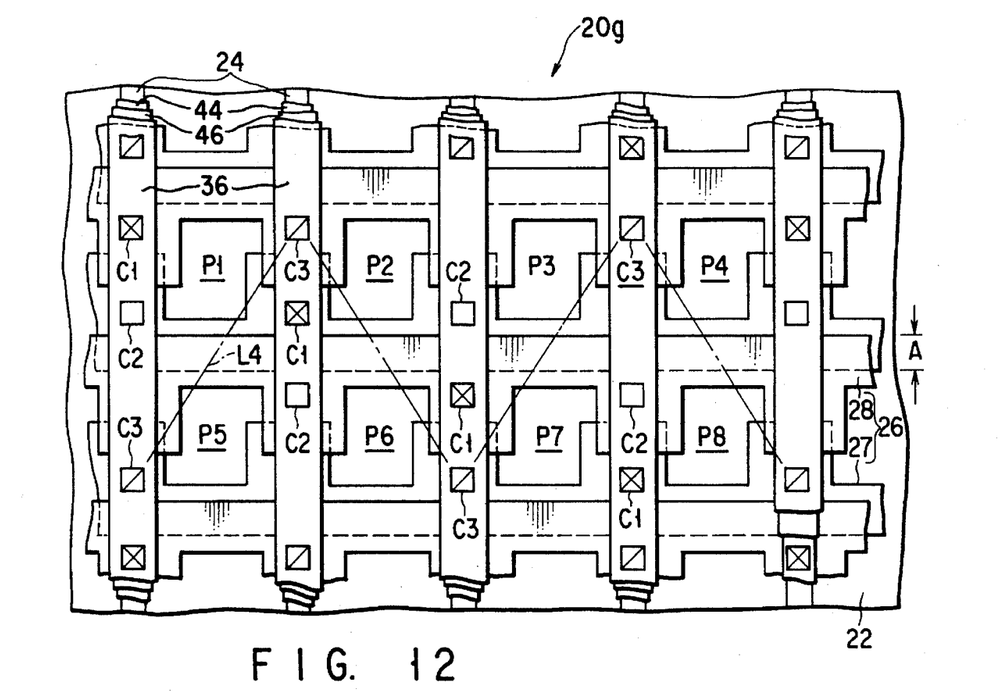

A CCD imager 20g shown in FIG. 12 is similar to the imager 20f of FIG. 10 with the third contact holes C3 being modified in distribution as follows. Looking at the eight pixels P1–P8, third contact holes C3 are formed at four of the five successive positions which correspond to the corner points of a virtual line L4 defining a vertically inverted letter "W" on the opposite sides of the spine overlap region E of the first and second vertical transfer electrode segments 27, 28, as shown in FIG. 12. With such an arrangement, the repeat period of the distribution pattern of the second and third contacts C2, C3 are two pixels in the both directions X, Y. Therefore, the contact spatial frequency fc can be half the sampling frequency fs more successfully. This embodiment will be preferably applicable to electronic equipments that come with more severe requirements for attaining higher image quality.

Figure 13:
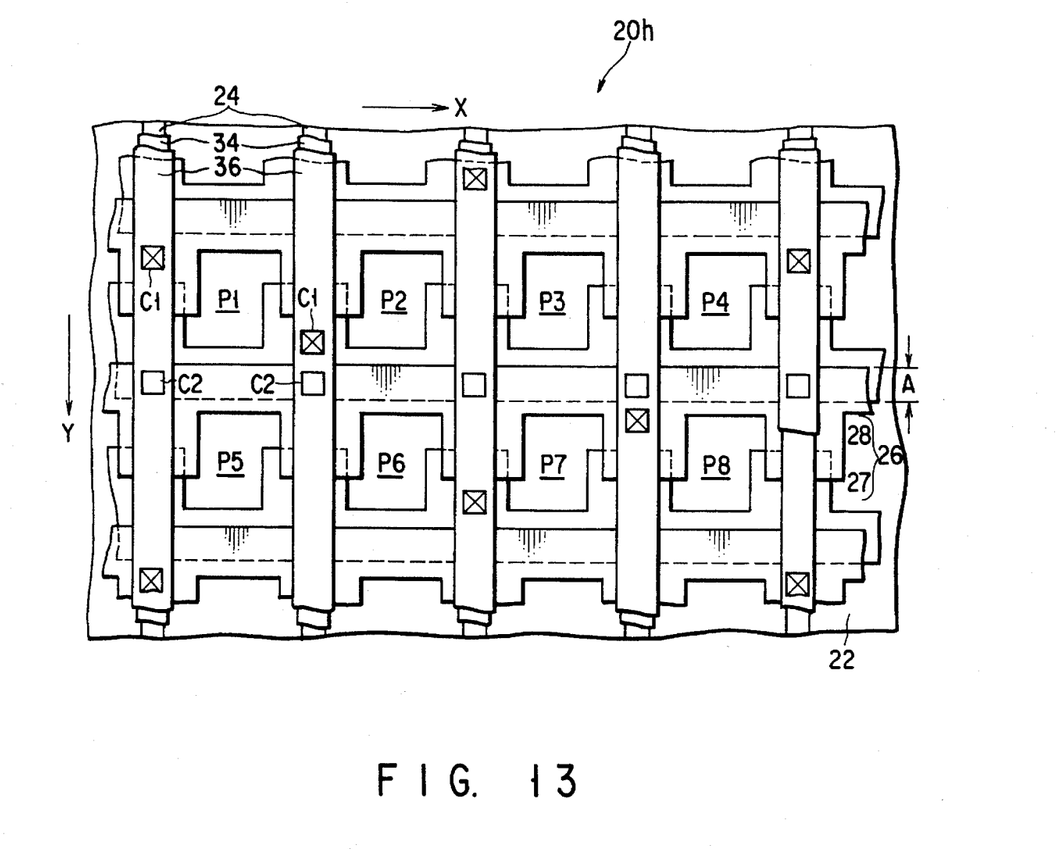

A CCD imager 20h shown in FIG. 13 is similar to the CCD imager 20a of FIG. 5 with the first contact holes C1 being modified so that two of the four contact holes C1 are positionally exchanged with each other at certain pixels P7, P8 of the eight pixels P1–P8 in the vertical direction Y. With such an arrangement also, similar advantages to those of the CCD imager 20a can be achieved.

Figure 14:
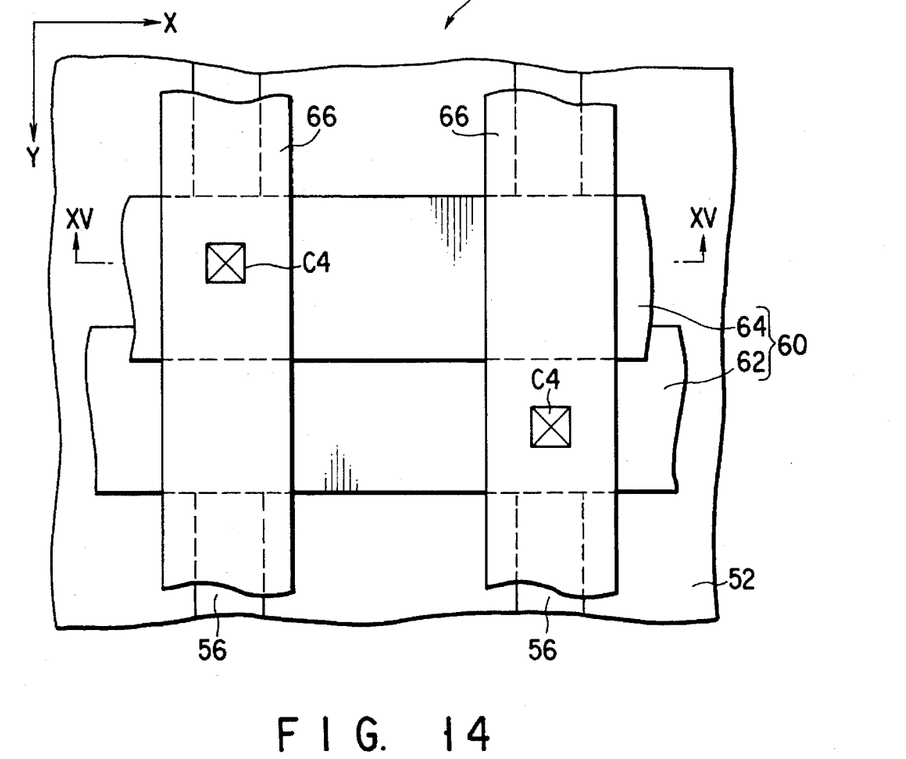
FIGS. 14 and 16 are partial plan views of CCD imagers in accordance with further embodiments of the invention.
Figure 15:
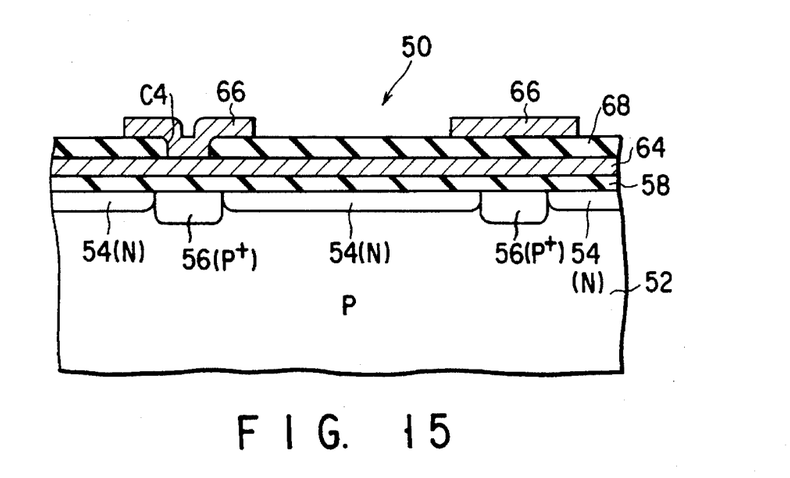
FIGS. 15 and 17 are diagrams showing the partial cross-sectional structure of each of the embodiments of the preceding figures.

Turning now to FIGS. 14 and 15, a CCD imager 50 in accordance with a further embodiment of the invention is generally designated by the numeral 50. FIG. 15 shows the cross-sectional view of the planar structure of FIG. 14 along the line XV—XV. The CCD imager 50 has a silicon substrate 52 of the p type conductivity. Substrate 52 has a plurality of parallel CCD channel layers 54 of n type conductivity, which are formed at the surface portion of substrate 52. CCD channels 54 extend in the vertical direction Y on the surface of substrate 52. A plurality of strip-like semiconductive diffusion layers 56 of p type conductivity are arranged between CCD channels 54 in such a manner that the width of each CCD channel 54 is defined by two spaced-apart diffusions 56 on the opposite sides of CCD channel 54. These diffusions 56 may act as element-separation layers.

A gate dielectric film 58 is formed on the surface of the substrate 52. A vertical transfer gate electrode section 60 is arranged on gate dielectric film 58. Vertical transfer gate electrode section 60 consists of first and second transfer gate strips 62, 64 that extend in a direction transverse to the elongate direction of the CCD channels 54, i.e., the horizontal direction X. The first transfer gate strips 62 (only one of them is visible in FIG. 14) are formed at a first level over the top surface of the substrate 52; the second transfer gate strips 64 are formed at a second level over the substrate surface. First and second transfer gate strips 62, 64 partly overlap with each other as shown in FIG. 14.

As illustrated in FIG. 14, a plurality of parallel conductive strips overlie the element separation layers 56 respectively with a dielectric layer 68 being sandwiched between vertical transfer gate section 60 and strips 66. Strips 66 may be made from low-resistance metal (aluminum, for example) to function as the shunt electrodes for vertical transfer gate section 60. Shunt electrodes 66 are electrically coupled by contact holes C4 with the underlying transfer gate segments 62, 64. Contact holes C4 are positioned above element separation layers 56 only; no contact holes C4 are formed above the CCD channels 54. With the embodiment, it becomes possible to eliminate almost perfectly the occurrence of "potential pockets" inside CCD channels 54 due to the presence of contact holes C4. The vertical signal-charge packet transfer performance can thus be enhanced.

Figure 16:
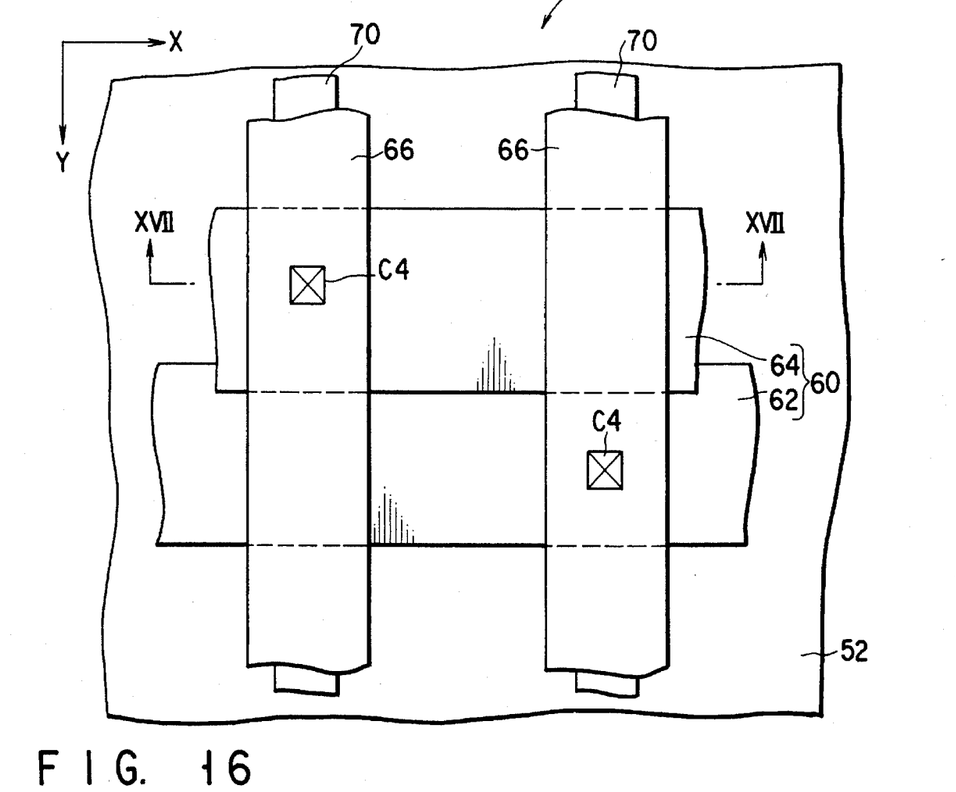
Figure 17:
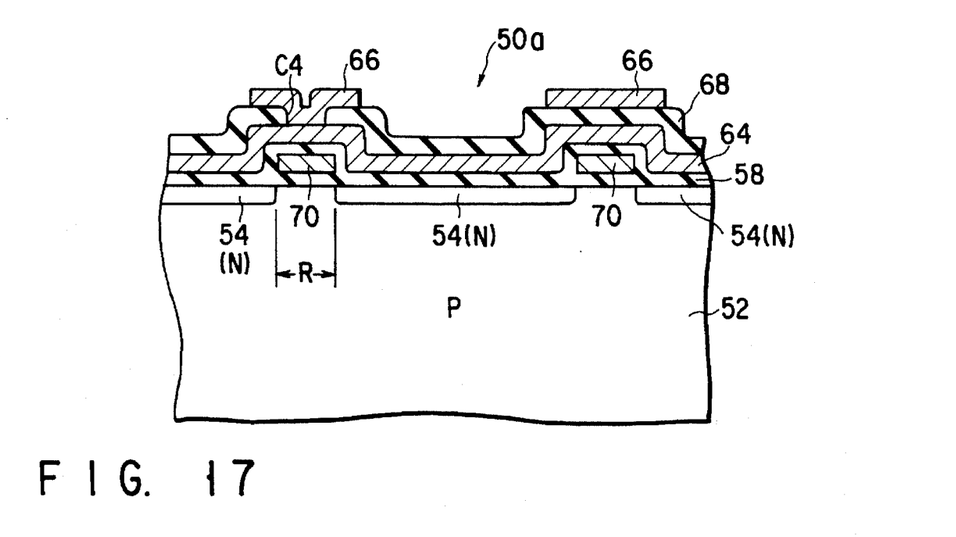

Another CCD imager 50a is shown in FIGS. 16 and 17, wherein FIG. 17 illustrates the cross-sectional view of the planar structure of FIG. 16 along the line XVII—XVII. The imager 50a is similar to that of FIGS. 14 and 15 with the element separation layers 56 of FIG. 15 being replaced by insulated element separation electrodes 70. These electrodes overlie element separation regions R, each of which is defined between adjacent ones of the CCD channels 54. Each of the element separation electrodes 70 forms an isolation region in a corresponding element separation region R beneath it, in response to a voltage signal externally supplied thereto. The transfer gate segments 62, 64 of the vertical transfer gate electrode section 60 extend in a direction orthogonally transverse to element separation electrodes 70. Contact holes C4 for electrically connecting transfer gate electrode section 60 to the shunt electrodes 66 are formed so that they are at the specific positions above element separation electrodes only. Similar advantages to those of the embodiment 50 can also be attained with the embodiment 50a.

The present invention is not limited to the above-described specific embodiments and may be practiced or embodied in still other ways without departing from the spirit or essential character thereof. For example, the buffer electrode(s) and shunt electrode as employed in the embodiments described previously may be modified in material when the invention is reduced to practice. The planar distribution patterns of the contact holes C1–C3 as shown in FIGS. 1, 5–10 and 12–13 may be variously modified by the practitioners in the CCD art while maintaining the significance of the invention.

What is claimed is:

1. A solid-state imaging device comprising:

a substrate;

an array of picture elements on said substrate;

a charge transfer section extending in a first direction and being associated with said picture elements, said charge transfer section including charge transfer channel regions in said substrate and charge transfer electrodes insulatively overlying said channel regions;

first elongate conductive layers arranged at a first level above said substrate to insulatively overlie said charge transfer electrodes;

second elongate conductive layers arranged at a second level above said substrate to insulatively overlie said first layers;

a plurality of first contacts for connecting said charge transfer electrodes and said first layers;

a plurality of second contacts for connecting said first layers with said second layers; and said second contacts being positioned to provide a distributed pattern having a repeat period that is two picture elements or less at least in a second direction transverse to the first direction on said substrate, whereby a spatial frequency of said second contacts at least in the second direction is half or more a sampling frequency of photoconversion of said device.

2. The device according to claim 1, wherein said first contacts are distributed so as to define a limited repeat period of two picture elements or less in the second direction, so that a spatial frequency of said first contacts at least in the second direction is half said sampling frequency or more.

3. The device according to claim 1, further comprising:

a plurality of third elongate conductive layers between said first layers and said second layers; and a plurality of third contacts allowing said third layers to be connected with the first and second layers.

4. The device according to claim 3, wherein said third layers are made from composite material of metal and semiconductor.

5. The device according to claim 1, wherein said charge transfer electrodes and said first layers are made from polycrystalline semiconductor material, whereas said second layers are made from metallic material.

6. A solid-state image sensing device comprising:

a substrate;

an array of rows and columns of picture elements on said substrate;

a charge transfer section extending in a first direction, and being associated with the columns of said picture elements, said charge transfer section including spaced-apart charge transfer channel regions in said substrate, and insulated charge transfer electrodes overlying said channel regions;

separation means for electrically separating adjacent channel regions, said separation means including a plurality of insulated conductive layers above the surface of said substrate, each of said insulated conductive layers overlying a substrate region defined between adjacent ones of said channel regions, and underlying said elongate conductive layers;

a plurality of elongate conductive layers insulatively overlying said charge transfer electrodes;

a plurality of contacts causing said charge transfer electrodes and said elongate conductive layers to be connected to each other; and said contacts being distributed so that said contacts are positioned exclusively above only said separation means or regions between channel regions and picture elements in a direction parallel to a charge transfer direction and prevented from positioning above said channel regions.

* * * * *